(12) United States Patent
Gavin et al.

(10) Patent No.: US 7,825,745 B1
(45) Date of Patent: Nov. 2, 2010

(54) VARIABLE BANDWIDTH TUNABLE SILICON DUPLEXER

(75) Inventors: Daniel Timothy Gavin, San Diego, CA (US); Peter Jivan Shah, San Diego, CA (US)

(73) Assignee: RF Magic Inc., San Diego, CA (US)

(*) Notice: Subject to any disclaimer, the term of this patent is extended or adjusted under 35 U.S.C. 154(b) by 0 days.

(21) Appl. No.: 11/845,054

(22) Filed: Aug. 25, 2007

Related U.S. Application Data

(60) Provisional application No. 60/825,387, filed on Sep. 12, 2006.

(51) Int. Cl.
*H03H 7/46* (2006.01)
(52) U.S. Cl. .................. 333/132; 333/126; 333/129
(58) Field of Classification Search .......... 333/124–129, 333/132, 134
See application file for complete search history.

(56) References Cited

U.S. PATENT DOCUMENTS

| | | | | |
|---|---|---|---|---|
| 5,029,294 A | * | 7/1991 | Kim ........................... | 340/988 |
| 5,786,763 A | * | 7/1998 | Canipe ..................... | 340/572.7 |
| 6,111,482 A | * | 8/2000 | Atokawa ..................... | 333/202 |
| 7,212,789 B2 | * | 5/2007 | Kuffner ....................... | 455/83 |
| 7,479,846 B2 | * | 1/2009 | Inoue et al. ................. | 333/133 |
| 2008/0231537 A1 | * | 9/2008 | Rofougaran et al. ........ | 343/850 |

* cited by examiner

*Primary Examiner*—Robert Pascal
*Assistant Examiner*—Kimberly E Glenn
(74) *Attorney, Agent, or Firm*—Bruce W. Greenhaus

(57) ABSTRACT

A tunable duplexer using voltage-controlled varactors is presented. The center frequency, the pass band, and the stop band are each tunable to meet system requirements. A calibration circuit driving digital to analog converters produces the necessary voltages used in the resonant circuits. The tunable duplexer can be fabricated on a single silicon chip. On-chip transformers can be used to reduce the voltage level of signals in the filters to improve the linearity of the duplexer.

11 Claims, 5 Drawing Sheets

VARIABLE BANDWIDTH TUNABLE SILICON DUPLEXER

RELATED APPLICATIONS

This application claims priority from U.S. provisional application No. 60/825,387 filed Sep. 12, 2006 entitled "Variable bandwidth tunable silicon duplexer", incorporated herein by reference.

BACKGROUND

1. Field of Invention

This invention relates to tunable duplexers.

2. Prior Art

A duplexer is a device that isolates a receiver signal from a transmitter signal while permitting a receiver and transmitter to share a common antenna. The duplexer must be capable of handling the transmitter power and be able to provide sufficient isolation to prevent receiver desensitization due to coupling of the transmitter signal into the receiver. When the transmit and receive frequencies are different, filters may be used to reduce the transmit signal levels to an acceptable low level at the receiver input.

Nontunable duplexers used in wide bandwidth systems such as CDMA systems use a well-known method of creating the wide pass band bandpass filters by cascading resonant sections coupled to additional sections. The more sections, the wider the pass band bandwidth. For example, for a CDMA system operating in the AMPSs band, the Tx frequency band is 824 to 849 MHz and the Rx frequency band is 869 to 894 MHz. Fixed nontunable duplexers must be designed to pass all channels in the band. This would require a nontunable filter with a pass band bandwidth of greater than 25 MHz to compensate for process and temperature variations. Many cascaded sections are also needed to achieve this bandwidth and steepness in the transition bands.

In the past, duplexers were a fixed design with the frequency bands of the transmit and receive bands predetermined. A tunable duplexer can simplify the design because of the ability to tune to the desired narrowband channel. The need for tunable duplexers existed and the following references reflect the current state of tunable duplexers and tunable filters.

U.S. Pat. No. 6,990,327 issued to Zheng et al entitled "Wideband Monolithic Tunable High-Q Notch Filter for Image Rejection in RF Application", incorporated herein by reference, describes a tunable notch filter which is contained on a single integrated chip.

U.S. Pat. No. 6,407,649 issued to Tikka et al entitled "Monolithic FBAR Duplexer and Method of Making the Same", incorporated herein by reference, describes a monolithic bulk acoustic wave (BAW) duplexer. A patterned piezoelectric material is used as the piexolayer for each of the resonators of the duplexer.

U.S. Pat. No. 6,816,714 issued to Toncich, entitled "Antenna Interface Unit", incorporated herein by reference, describes a ferro-electric tunable duplexer.

U.S. Patent Application Publication 2003/0199286, inventor D du Toit, entitled "Smart Radio Incorporating Parascan Varactors Embodied Within an Intelligent Adaptive RF Front End", incorporated herein by reference, describes a radio with an RF front end containing at least one tunable duplexer. The radio incorporates Parascan® electrically controlled dielectric varactors embedded within the RF front end. Parascan® is a trademarked tunable dielectric material developed by Paratek Microwave, Inc. The RF front end described in the publication contains a tunable duplexer and two tunable filters.

An article, entitled "A Novel Electronically Tunable Active Duplexer for Wireless Transceiver Applications", by B. Sundaram and R. Shastry, published June 2006 in Vol. 54, No. 6 of IEEE Transactions on Microwave Theory and Techniques, describes a 4-port duplexer circuit that uses varactors to enable electronic tuning of the frequency at which isolation is desired.

An article, entitled "Adaptive Duplexer Implemented Using Single-Path and Multipath Feedforward Techniques with BST Phase Shifters", by T. O'Sullivan, R. York, B. Noren, and P. Asbeck, published January 2005 in Vol. 53, No. 1 of IEEE Transactions on Microwave Theory and Techniques, describes a technique to enhance the isolation of a surface acoustic wave duplexer, which reduces the noise levels in the receive band of the system. Feedforward techniques are used to create an adaptive null in the receive band.

An article, entitled "A Varactor Tuned RF Filter", by A. Brown and G. Rebeiz, published Oct. 29, 1999 as a submission for review as a short paper to the IEEE Transactions on MTT, describes an electrically tunable filter at 1 GHz. The resonators used in the tunable filter are stripline interdigital fingers with varactor diodes at the ends.

U.S. Patent Application Publication 2005/0148312, inventors Toncich et al, entitled "Bandpass Filter with Tunable Resonator", incorporated herein by reference, describes a tunable bandpass filter comprising of ferroelectric tunable tank circuits.

SUMMARY OF INVENTION

The present invention is a duplexer circuit that can be used in applications requiring a single antenna port and communicate in full or half duplex mode. Examples include AMPS, GSM, CDMA and PCS cellular phones.

The duplexer circuit of an embodiment of this invention is tunable and can be implemented on a single silicon chip. The duplexer circuit contains tunable bandpass filters which are tuned electronically by varying the capacitance of tank circuits using on-chip or off-chip varactors.

The duplexer contains two tunable bandpass filters, one for received signals and one for transmitted signals, a combining network, and a calibration circuit for setting the values of the tunable elements of the filters. The calibration circuit can be implemented using a state machine.

To achieve the required channel selectivity and the required filter performance, the center frequency, the pass band and the stop band are tunable. The pass band frequency, width, and insertion loss, and the stop band frequency, attenuation, and width, are determined by system requirements.

The ability to tune the bandwidth of the pass band of the filter to a desired narrower bandwidth channel reduces the number of resonant sections required. With the frequency tunable duplexer of the present invention, the bandpass filter can be tuned to one narrow band channel, for example 5 MHz, requiring less resonant sections, fewer components and lower cost, while achieving better signal processing performance.

The duplexer can be made with low cost lower Q inductors. The tunable filter enables positioning of the transmission zeros, herein referred to as stop band zeros or stop band nulls, in the precise location to meet stop band rejection requirements. This ability in conjunction with being able to use narrow bandwidths in the pass band allow for the use of lower Q inductors to meet the steep pass band to stop band transitions necessary. A high attenuation at a nearby frequency relative to the pass band edge can be achieved.

Another advantage of the tunable duplexer is the ability to position stop band zeros such that the nulls created occur at frequencies of known narrowband interfering signals.

High linearity is achieved by using on-chip transformers to step the signal voltages down for signal processing, then stepping up the voltage at the interface ports. Distortion is proportional to the voltage across the varactors, therefore, with a lower voltage across the diodes, the distortion is lower and linearity is improved. Linearity is additionally improved by using "back-to-back" or "totem pole" stacked varactor diodes.

Both the transmit and receive bandpass filters (BPF) are tuned simultaneously to maintain acceptable input return loss, and acceptable pass band and stop band performance. The tuning is performed by the calibration circuit, which provides tuning voltages to the varactors.

DETAILED DESCRIPTION OF THE INVENTION

Figure 1:
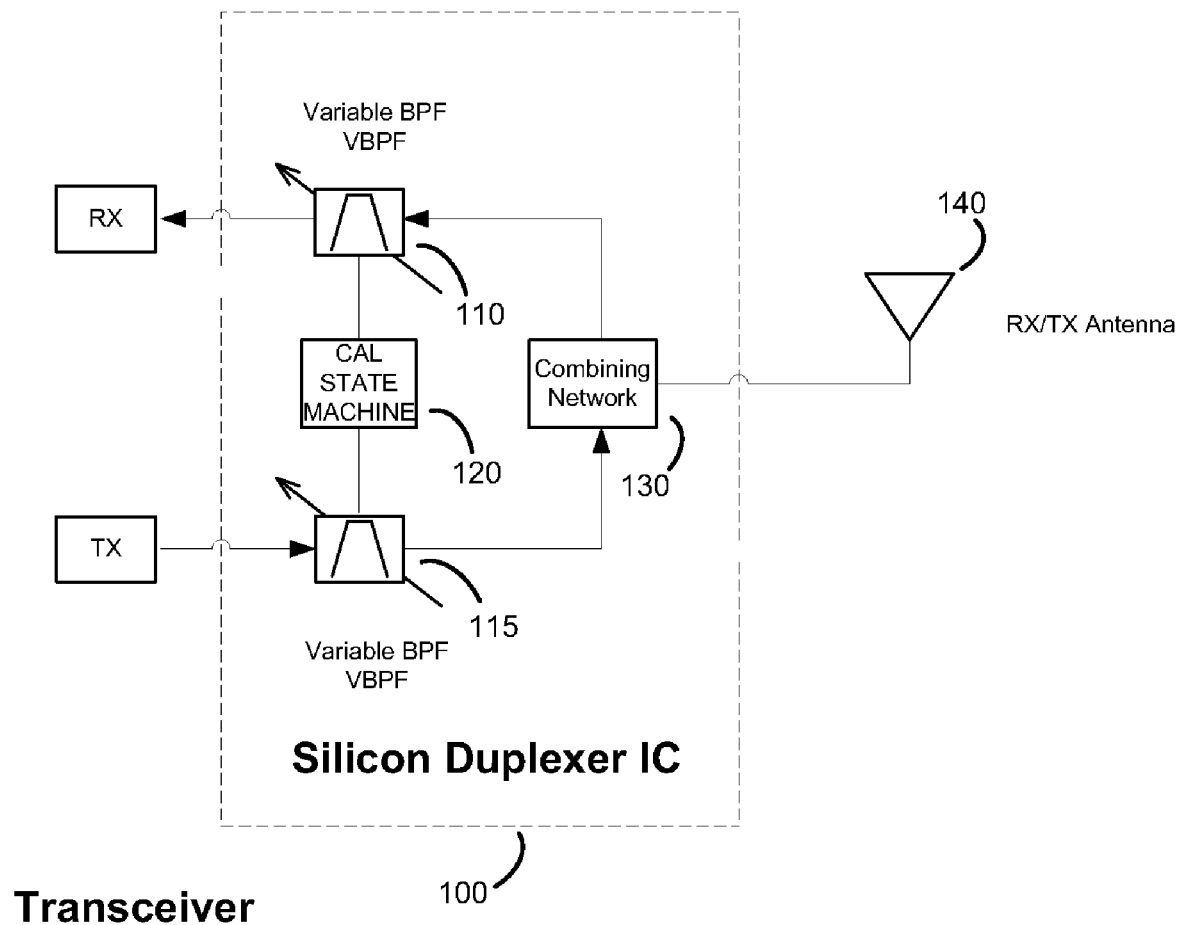
FIG. 1 shows the block diagram of the tunable duplexer of the present invention.

FIG. 1 shows an embodiment of the tunable duplexer 100 comprising of two varactor-tuned bandpass filters (BPFs), receiver bandpass filter 110 and transmitter bandpass filter 115, calibration circuit 120, and a combining network 130. Duplexed transmitted and received signals couple to TX/RX antenna 140. The tunable duplexer is fabricated substantially on a single integrated circuit chip.

The transmitter signal at the input of the BPF 115 is stepped down in voltage by on-chip transformers. This improves the linear dynamic range of the BPF. Similarily, the receive signal at the input of the BPF 110 can be stepped down prior to filtering and subsequently stepped up after filtering. The combining network 130 can be simply a node that connects the antenna to the output of the transmitter bandpass filter 115 and the input of the receiver bandpass filter 110. Due to the frequency dependent input and output characteristics of the bandpass filters 110 and 115, the out-of-band signal energy is reflected and the in-band energy is passed in a low loss or lossless connection at the combining node. The step-up and step-down ratios in the transmit and receive paths can be different ratios.

The filter 110 and 115 are comprised of cascaded image-parameter filter sections. Each section can be designed using well-known filter design techniques and circuit simulation tools, for example, Agilent's Advanced Design System (ADS). The filters 110 and 115 are combined with the combining network to form a duplexer. The center frequency, the pass band and the stop band are each tunable in order to achieve the desired selectivity, pass band and stop band performance. The tuning control is determined by the calibration circuit 120.

Calibration circuit 120 controls the tuning of the varactors used in the bandpass filters 110 and 115. The calibration circuit 120 tunes each of the filters 110 and 115 by controlling the voltage to the varactors of filters 110 and 115. The filters 110 and 115 have tunable center frequencies and tunable pass band and stop band bandwidths. Several independent tuning voltages may be required and used to tune the various parameters of the filters.

Figure 2:
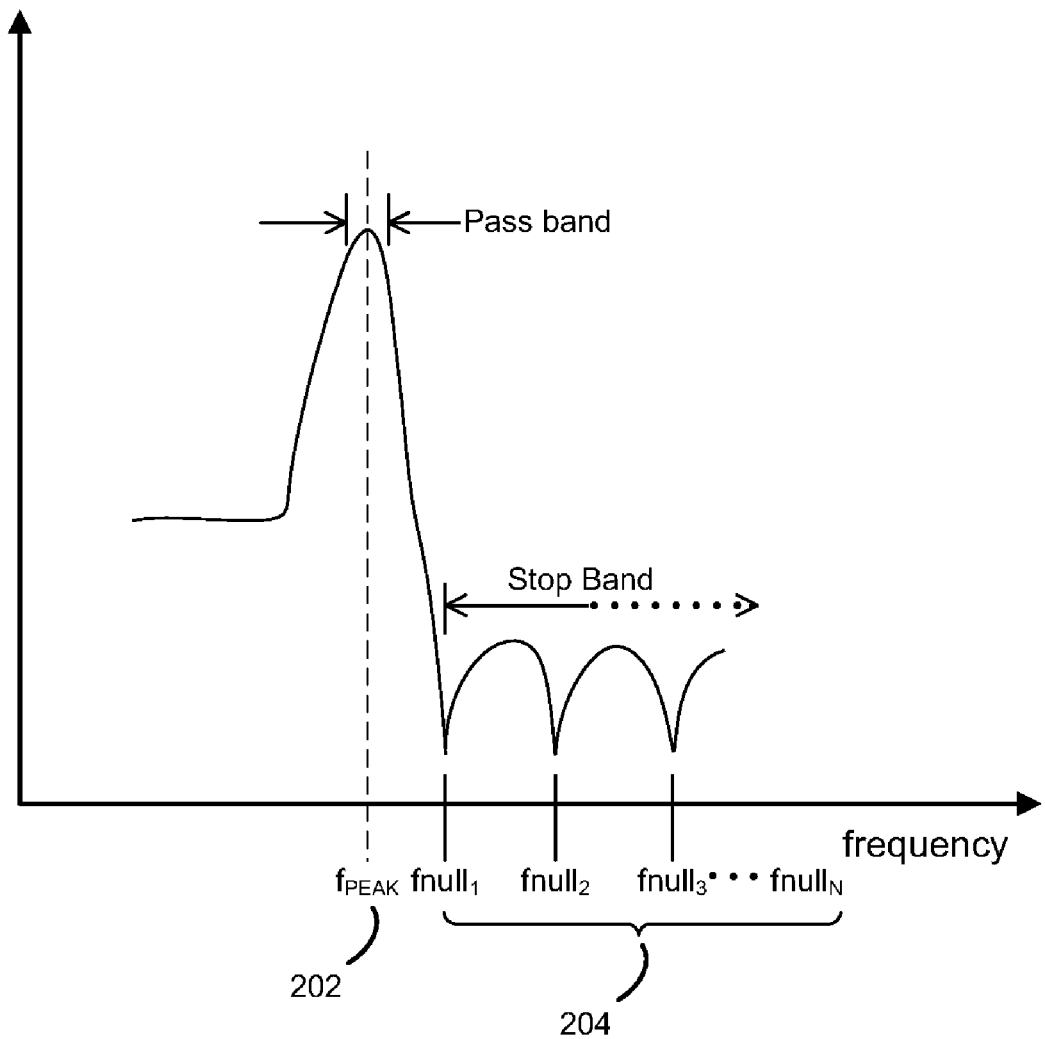
FIG. 2 shows a filter response of the present invention where the peak frequency and the null frequency are independently tuned.

FIG. 2 shows a response of one of the bandpass filters 110 or 115 where $f_{PEAK}$ 202 and $fnull_1$ to $fnull_N$ 204 can be independently tuned. The resonant peak of the filters with a nearby null provides a steep transition from the passband to the stop band. The stop band nulls can be tuned to narrowband interfering, or jammer, frequencies.

Figure 3:
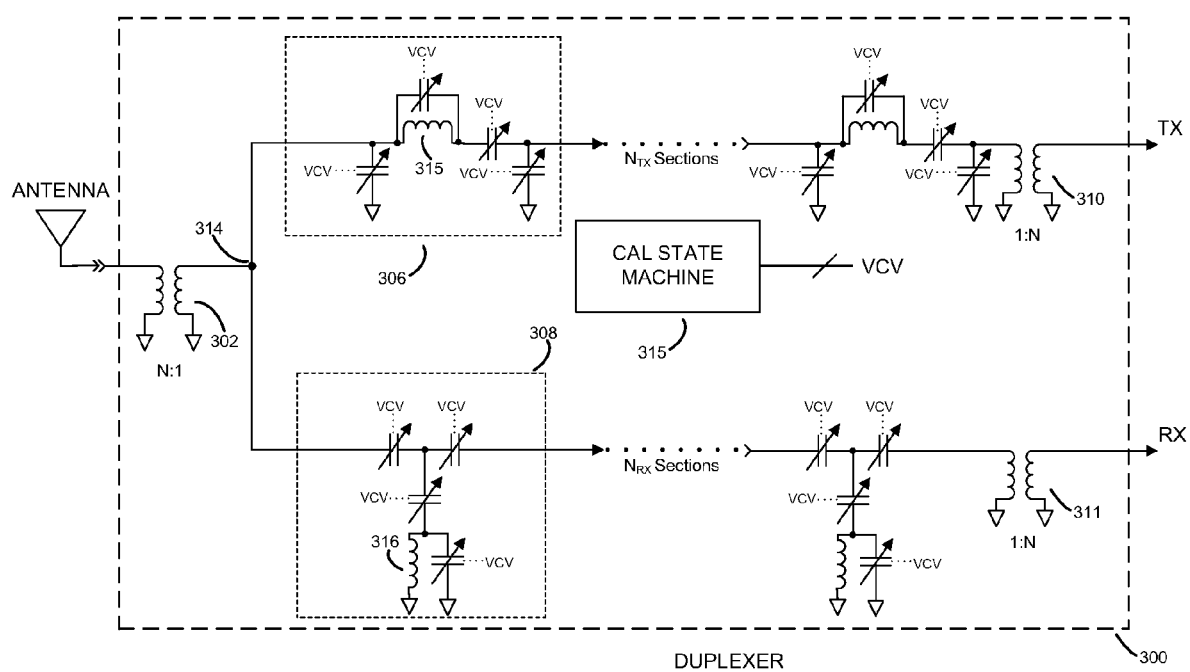
FIG. 3 shows the schematic of the tunable duplexer of the present invention.

FIG. 3 shows the schematic of an embodiment of the present invention, duplexer 300. Distortion is proportional to the voltage across the varactors; therefore, if the voltage is lower across the varactors, distortion is lower and linearity is improved. In this embodiment of the present invention, a lower voltage is achieved across the varactors by using step-down transformers. Transformer 310 steps down the transmit signal. Transformer 302 steps down the received input signal and steps up the transmitted output signal, preferably with a ratio in the range of 1 to 10, or higher or lower ratios. The ratio is dependent on the center frequency and insertion loss requirements. The combining network may be a node as shown as node 314 that connects the antenna transformer to the transmit and receive filters. Filter block 306 shows the circuitry of one section of the Tx bandpass filter. The duplexer 300 may contain one or more instances of filter block 306. Filter block 308 shows the circuitry of one section of the Rx bandpass filter. The number of filter blocks 306 and 308 needed is dependent on the required bandwidth and loss for the system. The inductors 315 and 316 in filter blocks 306 and 308 may be on-chip or off-chip. Transformers 310 and 311 may be on-chip transformers that step down the transmitter power amplifier signal and step up the signal coupled to the receiver.

Transformers 302, 310 and 311 also function to transform impedance where the impedance of the filters can be higher or lower than the impedance of the antenna, transmitter circuit, and receiver circuit. For the ratios shown, the impedance of the filters would be lower by a factor of the square of N. The ratio of each transformer does not need to be the same.

The calibration state machine 315 supplies the voltages to the voltage controlled varactors of filter blocks 306 and 308. The calibration state machine 315 produces the varactor control voltages for determining the center frequencies of the Tx and Rx bandpass filters and the voltages for determining the bandwidth and stop band frequencies for each filter. In one embodiment, the varactor control voltages are produced by digital-to-analog (D/A) converters driven by the calibration state machine 315. The voltages may also be produced by D/A converters driven by a microprocessor.

To improve linearity, the varactors of filter sections 306 and 308 can be high voltage varactors. The high voltage varactors can be well-to-substrate junctions or can be fabricated with either existing process steps present on a standard low-cost IC process or with the addition of one or more process steps. An example fabrication technique to form a varactor is using the collector-base junction of a bipolar transistor by appropriately adjusting the implant doses to create a large capacitance tuning range across a high voltage range.

An alternative to achieving improved linearity without the use of high voltage varactors is to switch in multiple fixed value capacitors in parallel with the varactors in the filter. Since a larger proportion of the total capacitance now consists of linear capacitance, the linearity improves and the varactor may no longer need to be of a high-voltage type.

Tuning can be open loop with the voltages driven from a table of predetermined or premeasured values. The predetermined voltage values can be determined during filter synthesis. A set of varactor control voltages are generated for each desired tuning frequency of the duplexer. Additionally, temperature coefficients may be predetermined and added to a table to account for temperature variations. Utilizing temperature monitoring, the predetermined or premeasured voltage values can be adjusted by the temperature coefficients stored in the table.

Alternatively, tuning can be performed using an injected test tone to measure critical filter frequencies, such as the center frequency, bandwidth, and stop band nulls. The injected signal can be swept across the desired operating frequency range to verify the position of critical operating frequencies and provide information for making adjustments to tuning voltages. Open loop tuning can be aided by a calibration measurement made when the system is powered up, periodically, or each time a channel is changed, or each time a call is initiated. The calibration measurement can update the table of values or correction factors.

By implementing the varactors on-chip, techniques for compensating for environmental changes may be improved. Specifically, the temperature coefficients of the on-chip varactors will match very well and this allows the use of a reference varactor whose temperature and temperature coefficient will match very closely with the varactors used in the filters. The capacitance of the reference varactor can be monitored and its tuning voltage can be automatically adjusted to ensure constant capacitance. Alternatively, a full tuning curve can be measured. The reference varactor tuning information can be used to update the tuning voltage of the filter varactors, thereby ensuring very accurate compensation of capacitance drift due to temperature changes, power supply voltage changes, ageing, and other sources of drift.

The Tx and Rx filter topologies are influenced by the relationship of the transmit and receive frequencies. The Tx stop band frequency generally corresponds to the Rx pass band and the Rx stop band should fall into the Tx pass band. For the example shown in FIG. 3, the Rx pass band is higher in frequency than the Tx pass band.

The varactor capacitance values are interrelated and are determined when the duplexer is synthesized according to system requirements. The values of the voltages that correspond to the capacitance values reside in the calibration state machine or microprocessor. Each filter section produces one null. Therefore, as the number of sections increases, the number of stop band null frequencies increase.

Figure 4:
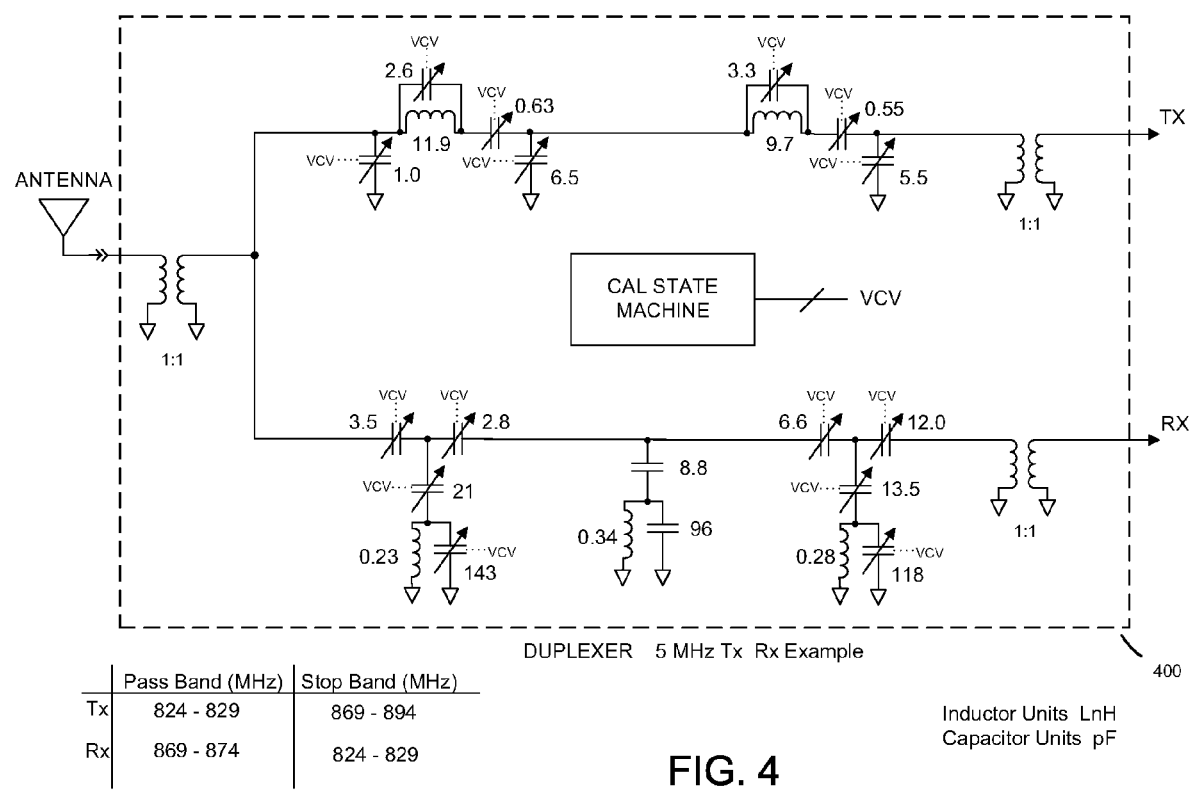
FIG. 4 shows an example of a schematic of the tunable duplexer of the present invention with varactor capacitance values and inductor values.

FIG. 4 shows an example of a schematic of the tunable duplexer of the present invention with actual varactor capacitance values and inductor values. The Tx pass band for this example is 824 to 829 MHz and the Tx stop band is 869 to 894 MHz. The Rx pass band is 869 to 874 MHz and the Rx stop band is 824 to 829 MHz.

Figure 5:
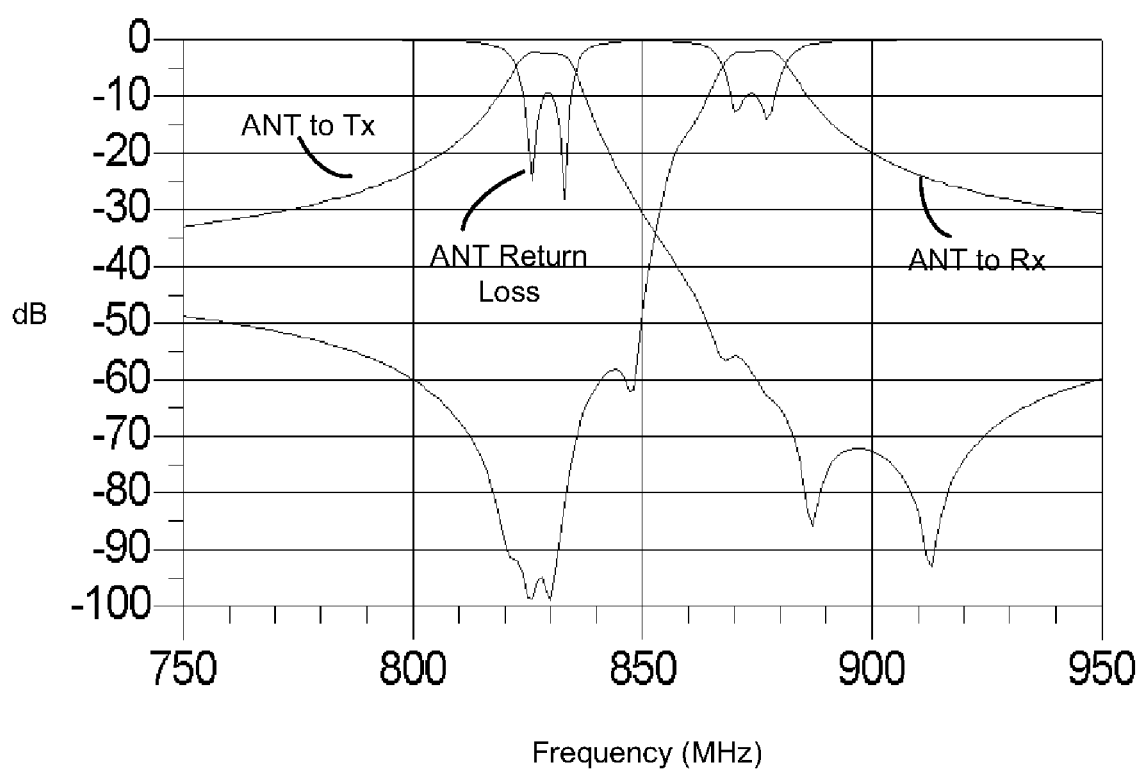
FIG. 5 shows the response of the filters using the varactor capacitance values and inductor values given in FIG. 4.

FIG. 5 shows the response of the filters using the varactor capacitance values and inductor values given in FIG. 4.

The duplexer of the present invention can be used with transceivers that have selectable frequencies. When the transceiver is tuned to the desired transmit and receive frequencies, the tunable duplexer will also tune to match the frequencies of the transceiver.

What is claimed is:

1. A tunable duplexer used for full duplex communication having an antenna port, a transmit port and a receive port for use in applications requiring operation with a single antenna comprising:
   a tunable narrow bandwidth transmit bandpass filter with a tunable stop band null and a tunable narrow bandwidth receive bandpass filter with a tunable stop band null, both the narrow bandwidth transmit bandpass filter and the tunable narrow bandwidth receive bandpass filter comprising a varactor used in a resonant circuit, the transmit filter connected between the transmit port and to a combining node, the receive filter connected between the receive port and the combining node, and the antenna port connected to the combining node;
   a step-down transformer connected between the antenna port and the combining node; and
   two step-up transformers connected between the transmit and receive ports and the bandpass filters.

2. A tunable duplexer used for full duplex communication having an antenna port, a transmit port and a receive port for use in applications requiring operation with a single antenna comprising:
   a tunable narrow bandwidth transmit bandpass filter with a tunable stop band null and a tunable narrow bandwidth receive bandpass filter with a tunable stop band null, both the narrow bandwidth transmit bandpass filter and the tunable narrow bandwidth receive bandpass filter comprising a varactor used in a resonant circuit, the transmit filter connected between the transmit port and to a combining node, the receive filter connected between the receive port and the combining node, and the antenna port connected to the combining node;
   a state machine to determine voltages used to control the varactors, the state machine having outputs; and
   a plurality of digital-to-analog converters to convert the outputs of the state machine to a voltage necessary to control the varactors.

3. A tunable duplexer used for full duplex communication having an antenna port, a transmit port and a receive port for use in applications requiring operation with a single antenna comprising:
   a tunable narrow bandwidth transmit bandpass filter with a tunable stop band null and a tunable narrow bandwidth receive bandpass filter with a tunable stop band null, both the narrow bandwidth transmit bandpass filter and the tunable narrow bandwidth receive bandpass filter comprising a varactor used in a resonant circuit, the transmit filter connected between the transmit port and to a combining node, the receive filter connected between the receive port and the combining node, and the antenna port connected to the combining node;
   a tunable filter section comprising the tunable narrow bandwidth receive bandpass filter, an inductor and a at least one additional varactor the inductor and at least one of the varactors within the tunable filter section each with independent control voltages to independently tune a passband center frequency, a stop band null, and a bandwidth of the tunable filter section.

4. The tunable duplexer of claim 3 wherein the frequency of the stop band null is a frequency of a narrowband interfering signal.

5. A tunable duplexer used for full duplex communication having an antenna port, a transmit port and a receive port for use in applications requiring operation with a single antenna comprising:

a tunable narrow bandwidth transmit bandpass filter with a tunable stop band null and a tunable narrow bandwidth receive bandpass filter with a tunable stop band null, both the narrow bandwidth transmit bandpass filter and the tunable narrow bandwidth receive bandpass filter comprising a varactor used in a resonant circuit, the transmit filter connected between the transmit port and to a combining node, the receive filter connected between the receive port and the combining node, and the antenna port connected to the combining node; and a reference varactor having a capacitance, wherein the capacitance of the reference varactor is monitored and reference varactor tuning information is used to update a tuning voltage of the filter varactors to compensate for filter varactor drift.

6. A tunable duplexer circuit having an antenna port, a transmit port and a receive port for use in applications requiring operation with a single antenna comprising:

a first transformer connected between the antenna port and a combining node;

a tunable narrow bandwidth transmit bandpass filter for filtering a transmit signal connected to the combining node comprising a plurality of voltage-controlled varactors used in at least one resonant circuit;

a second transformer connected between the transmit port and the tunable transmit bandpass filter;

a tunable narrow bandwidth receive bandpass filter for filtering a received signal connected to the combining node comprising a plurality of voltage-controlled varactors used in at least one resonant circuit;

a third transformer connected between the receive port and the tunable receive bandpass filter;

a calibration circuit to determine voltages used to control the varactors, the calibration circuit having at least one output; and a plurality of digital-to-analog converters to convert the outputs of the calibration circuit to a voltage necessary to control the varactors.

7. The tunable duplexer of claim 6 wherein the calibration circuit is a state machine.

8. The tunable duplexer of claim 6 wherein the first transformer steps up the transmit signal and steps down the received signal; the second transformer steps down the transmit signal before filtering and third transformer steps up the received signal after filtering.

9. The tunable duplexer of claim 6 wherein the duplexer is used for full duplex communication.

10. The tunable duplexer of claim 6 wherein the duplexer is used for half duplex communication.

11. The tunable duplexer of claim 6 wherein the tunable narrow bandwidth transmit bandpass filter further comprises a tunable stop band null;

and the tunable narrow bandwidth receive bandpass filter further comprises a tunable stop band null.

* * * * *